United States Patent [19]
Fujita et al.

[11] Patent Number: 5,485,039
[45] Date of Patent: Jan. 16, 1996

[54] SEMICONDUCTOR SUBSTRATE HAVING WIRING CONDUCTORS AT A FIRST MAIN SURFACE ELECTRICALLY CONNECTED TO PLURAL PINS AT A SECOND MAIN SURFACE

[75] Inventors: Yuuji Fujita, Koganei; Kenichi Mizuishi, Hachioji, both of Japan

[73] Assignee: Hitachi, Ltd., Tokyo, Japan

[21] Appl. No.: 990,029

[22] Filed: Dec. 14, 1992

[30] Foreign Application Priority Data

Dec. 27, 1991 [JP] Japan .................. 3-345833

[51] Int. Cl.⁶ .................. H01L 23/48; H01L 29/44; H01L 29/52; H01L 29/60
[52] U.S. Cl. .................. 257/774; 257/697; 257/713; 257/723; 257/777
[58] Field of Search .................. 257/697, 668, 257/701, 702, 713, 714, 776, 686, 719, 747, 777, 778, 723

[56] References Cited

U.S. PATENT DOCUMENTS

| | | | |
|---|---|---|---|
| 4,021,838 | 5/1977 | Warwick | 257/778 |
| 4,074,342 | 2/1978 | Honn et al. | 257/747 |
| 4,338,621 | 7/1982 | Braun | 357/74 |
| 4,561,006 | 12/1985 | Currie | 357/28 |
| 4,823,234 | 4/1989 | Konishi et al. | 361/386 |
| 4,866,841 | 9/1989 | Hubbard | 29/845 |
| 4,893,174 | 1/1990 | Yamada et al. | 257/777 |
| 4,953,060 | 8/1990 | Lauffer et al. | 257/713 |
| 5,006,922 | 4/1991 | McShane et al. | 357/74 |
| 5,016,087 | 5/1991 | Haug et al. | 257/778 |
| 5,025,347 | 6/1991 | Shindo et al. | 361/386 |
| 5,266,912 | 11/1993 | Kledzik | 257/777 |

FOREIGN PATENT DOCUMENTS

| | | | |
|---|---|---|---|
| 62-040754 | 2/1987 | Japan | 257/697 |
| 62-73651 | 4/1987 | Japan . | |
| 62-106635 | 5/1987 | Japan | 257/697 |
| 62-123743 | 6/1987 | Japan | 257/697 |
| 63-253658 | 10/1988 | Japan | 257/697 |
| 63-285960 | 11/1988 | Japan | 257/697 |
| 63-310145 | 12/1988 | Japan | 257/714 |
| 2-60156 | 2/1990 | Japan . | |
| 03060059 | 3/1991 | Japan | 257/719 |
| 3-292761 | 12/1991 | Japan | 257/697 |
| 3-283641 | 12/1991 | Japan | 257/774 |
| 04010559 | 1/1992 | Japan | 257/697 |
| 4-263462 | 9/1992 | Japan | 257/774 |

OTHER PUBLICATIONS

Proceedings of International Conference on Wafer Scale Integration, Jan. 1989, pp. 55–64.

Primary Examiner—Rolf Hille
Assistant Examiner—T. M. Arroyo
Attorney, Agent, or Firm—Fay, Sharpe, Beall, Fagan, Minnich & McKee

[57] ABSTRACT

A semiconductor device includes a semiconductor substrate having a pair of opposed main surfaces with a wiring conductor provided on one of the main surfaces; the substrate having at least one through hole extending therethrough so as to be perpendicular to the main surfaces; at least one electrically conductive pin provided on the other of the main surfaces at a position of the at least one through hole, and an adhesive filled into the at least one through hole for fixing the at least one conductive pin to the substrate, wherein the at least one conductive pin is connected electrically through the corresponding at least one through hole to the wiring conductor to transmit/receive an electrical signal to/from an external circuit.

49 Claims, 6 Drawing Sheets

SEMICONDUCTOR SUBSTRATE HAVING WIRING CONDUCTORS AT A FIRST MAIN SURFACE ELECTRICALLY CONNECTED TO PLURAL PINS AT A SECOND MAIN SURFACE

BACKGROUND OF THE INVENTION

The present invention relates to semiconductor devices and methods of making same and more particularly to a semiconductor device, suitable for realizing a high multi-computer in which a plurality of processors are connected in high density, and a method for making same.

In order to perform high speed calculations in a computer, it is necessary to mount semiconductor elements in high density on a wiring board, to take as many signals as possible from the respective semiconductor elements and to connect them to each other. One system of taking many signals from semiconductor elements is CCB (Controlled Collapse Bonding). In this system, input/output terminals are disposed in a two-dimensional structure on a semiconductor substrate on which circuits are formed and connected through low melting-point metals such as solder balls. Thus, areas required for taking signals are reduced to thereby achieve high density wiring connections.

Another method, for example, as disclosed in JP-A-62-73651 (laid-open on Apr. 4, 1987), is to provide feed-through paths which electrically connect a front and a back surface of a semiconductor substrate, and to connect fine pins to the feed-through paths on the back surface of the substrate to take signals from the semiconductor substrate. The feed-through paths in this system are formed by a thermomigration technique, as disclosed in PROCEEDINGS OF THE INTERNATIONAL CONFERENCE ON WAFER SCALE INTEGRATION, Jan. 1989, pp.55–64.

However, when semiconductor elements are made finer and the number of input/output terminals on the substrate further increases, these connection terminals are required to be shrunk further. Therefore, distortion under thermal expansion is rapidly increased due to thinning of the connection terminals to thereby rapidly deteriorate the reliability of connection, for example, of the life-time for interconnection under thermal cycling in a system where semiconductor elements and the input/output terminals on the substrate are connected through solder balls, as utilized in the CCB system.

According to the system disclosed in JP-A-62-73651, an increase in the aspect ratio (length/diameter) of the pins reduces distortion under thermal expansion, so that a fine connection structure having a high reliability of connection is achieved compared to the CCB system. According to the present system, input/output terminals are provided on the front and back surfaces of the semiconductor substrate, and wiring conductors are provided which connect the input/output terminals within the substrate. Therefore, laminating the semiconductor substrates in a three-dimensional structure and connecting the input/output terminals achieves a higher degree of integration. Since in the thermomigration for the formation of the feed-through paths, however, small aluminum pieces are disposed on an N-type wafer substrate, a thermal gradient of about 150° C./cm is provided from the front surface of the wafer toward its back surface within an atmosphere of about 1000° C., and thermal diffusion of aluminum into the Si to provide P-type through hole conductors, dimensional accuracies of the individual through hole conductors and the accuracy of electrical conductivity are determined by the accuracy of dimensions and alignment of the aluminum pieces and the accuracy of control of the environmental temperature of the wafer. Therefore, reduction of the pitch of the through hole conductors, an increase in the number of terminals or an increase in the size of the wafer renders difficult alignment and uniform heating of all the through hole conductors for formation of the through hole conductors with high accuracy. Since heat treatment at a high temperature such as about 1000° C. is performed, thermal distortion would remain in the resulting wafer. As the semiconductor elements are narrowed, the characteristics of the devices are greatly deteriorated.

Further, when in the conventional techniques conical holes formed on the wafer back surface are filled with low-melting point metals, the fluidity of the low-melting point metals is reduced as the holes are narrowed to thereby produce voids within the low-melting point metals. Therefore, stress is concentrated on the periphery of the voids to greatly reduce the reliability of the connection. In addition, significant unevenness occurs in the electrical conductivity of the through hole conductors. In elements such as bipolar elements where a large current is consumed, a voltage drop across the power source terminals varies from element to element, so that there is a probability of erroneous operation of the circuits.

SUMMARY OF THE INVENTION

It is an object of the present invention to provide a semiconductor device which solves these problems, has many high-accuracy through holes, and is excellent in the reliability of connection and suitable for a high density three-dimensional layer, and a method of making the semiconductor device.

In order achieve the above object, according to one aspect of the present invention, there is provided a semiconductor device comprising a semiconductor substrate having a pair of opposite main surfaces with a wiring conductor provided on one of the main surfaces, the substrate having at least one through hole extending therethrough so as to be perpendicular to the main surfaces, at least one electrically conductive pin provided on the other of the main surfaces at a position of the at least one through hole for transmitting/receiving an electrical signal to/from an external circuit, and an adhesive filled into the at least one through hole. The at least one conductive pin is fixed by the adhesive to the semiconductor substrate and connected electrically through the at least one through hole to the wiring conductor.

The semiconductor device is preferably constructed by forming at least one through hole extending through a semiconductor substrate with a wiring conductor formed on the substrate; coating an adhesive on the other main surface of the substrate; inserting at least one electrically conductive pin partially into the corresponding at least one through hole from the other main surface of the substrate; disposing a contacting plate so as to contact the one main surface of the substrate within a chamber having a predetermined inner pressure to hermetically seal the at least one through hole with the at least one conductive pin, adhesive and contacting plate; maintaining the adhesive in a melted state to increase the pressure within the chamber to thereby fill the adhesive into the at least one through hole; and solidifying the adhesive to fix the at least one conductive pin in a lump to the substrate.

In one embodiment of the present invention, the through hole conductor is formed by the connection of the at least one conductive pin inserted into the corresponding at least one through hole and the wiring conductor on the semiconductor substrate. Forming the at least one conductive pin with high accuracy beforehand facilitates the formation of the dimensions and electrical conductivity of all the through hole conductors with uniformness and high accuracy.

Fixing the conductive pin may be performed with an adhesive such as a low-melting point metal filled into the corresponding through hole formed by a YAG laser. Therefore, the temperature of processing the wafer is greatly reduced compared to the conventional technique to thereby prevent the production of thermal distortion in the wafer.

The inventive semiconductor device is manufactured by hermetically sealing the at least one through hole with the contacting plate which contacts the semiconductor substrate closely, the conductive pin and the adhesive, maintaining the adhesive in a melted state in the atmosphere of a predetermined pressure, and increasing the pressure to solidify the adhesive. The use of a contacting plate, the material of which is difficult to wet the adhesive leaves voids in a gap between the contacting plate and the adhesive. After the adhesive is filled, the contacting plate is removed. Therefore, the rate of production of voids within the adhesive is reduced to thereby greatly improve the reliability of connection for the through hole conductors.

By the above action, the present invention provides a semiconductor device which is capable of forming many through hole conductors with high accuracy, and preventing the production of thermal distortion in the wafer, and is excellent in the reliability of connection and forming a high density three-dimensional lamination, and a method of making same.

DETAILED DESCRIPTION OF THE PREFERRED EMBODIMENTS

Figure 1:
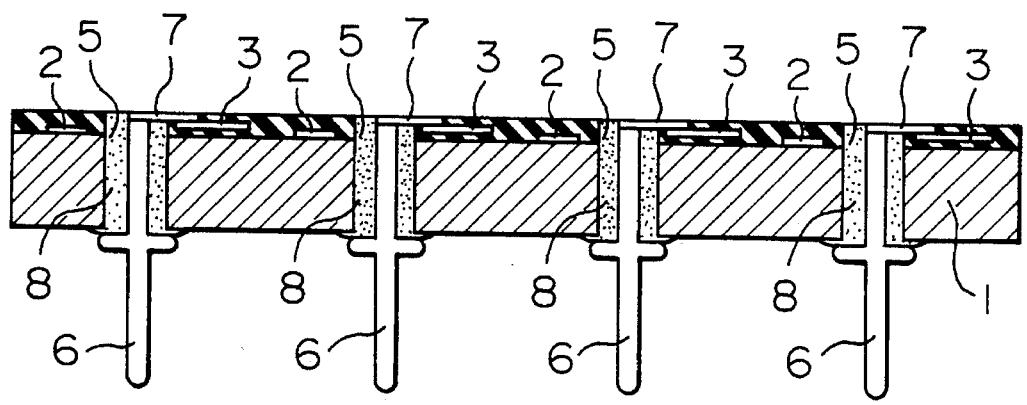
FIG. 1 is a cross-sectional view of a semiconductor device as a first embodiment of the present invention.

FIG. 1 is a cross-sectional view of a semiconductor device as an embodiment of the present invention.

In FIG. 1, reference numeral 1 denotes a semiconductor substrate; 2, active devices such as transistors formed on the substrate 1; 3, wiring conductors formed on the substrate 1 and cooperating with the active devices 2 to form electrical circuits on the substrate 1; and 6, electrically conductive pins which take and deliver signals from and to the electrical circuits.

Figure 2:
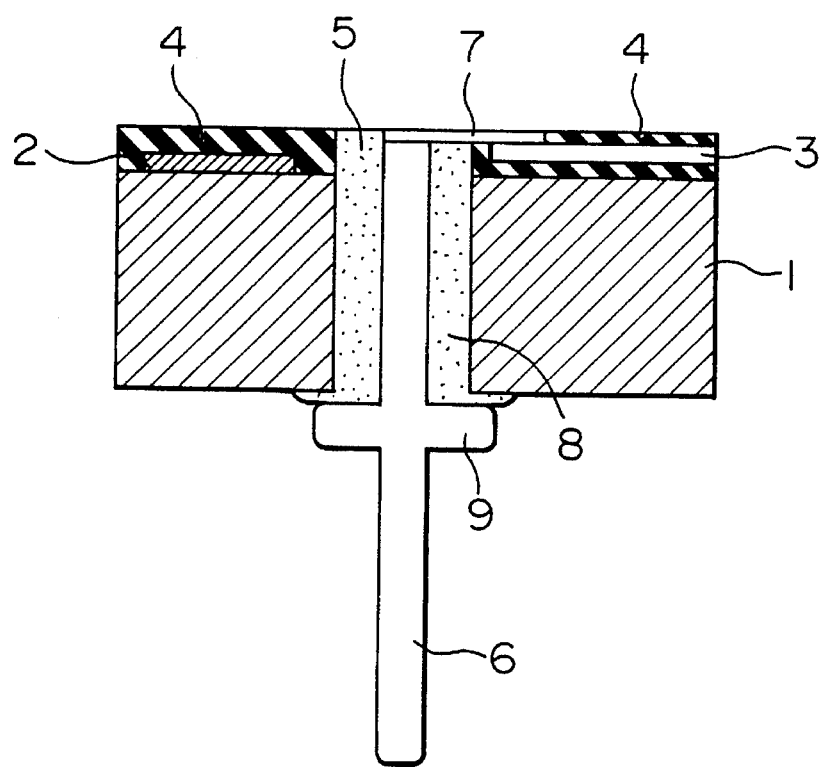
FIG. 2 is a partly cross-sectional view of the semiconductor device.

FIG. 2 is a partly cross-sectional view of the semiconductor device.

Through holes 5 are formed so as to extend normal to a main surface of the substrate 1. The conductive pins 6 are inserted through the corresponding holes 5 and connected electrically by leads 7 to the wiring conductors 3 which are supplied with input/output signals and power through the conductive pins 6. The through holes 5 are filled with adhesive 8 to fix the pins 6 at predetermined positions. The pins 6 are provided with seats 9 which contact the back surface of the substrate 1 to support the weight of the substrate 1 and ensures the contact to the leads 7. The pins 6 may be made of copper, brass, covar or platinum. The seats 9 are formed by grinding, plastic working or etching. The pins 6 may be plated with gold in order to ensure the adhesiveness to the leads 7. While the connection of the pins 6 and wiring conductors 3 is made by the leads 7 which are formed by gold plating or deposition, they may be connected by wire bonding.

FIGS. 3–9 are the cross-sectional views of the semiconductor device of FIG. 1, showing the respective steps of manufacturing the semiconductor device.

Figure 3:
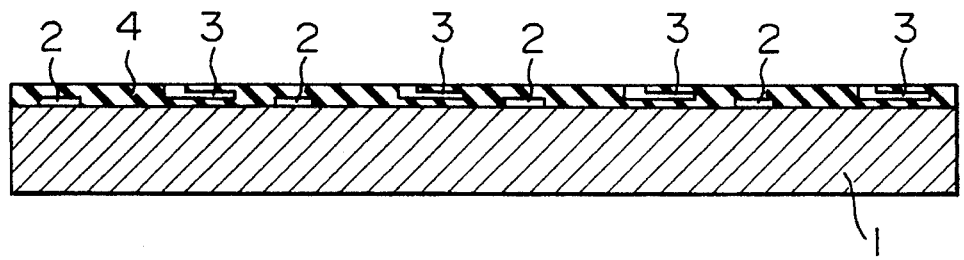
FIG. 3 is a cross-sectional view of the semiconductor device at one manufacturing step.
Figure 4:
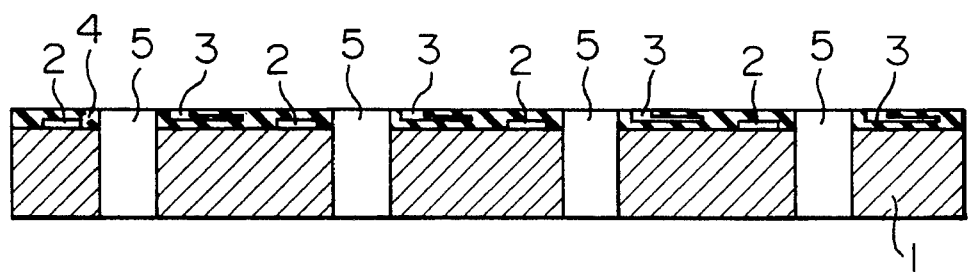
FIG. 4 is a cross-sectional view of the semiconductor device at one manufacturing step.
Figure 5:
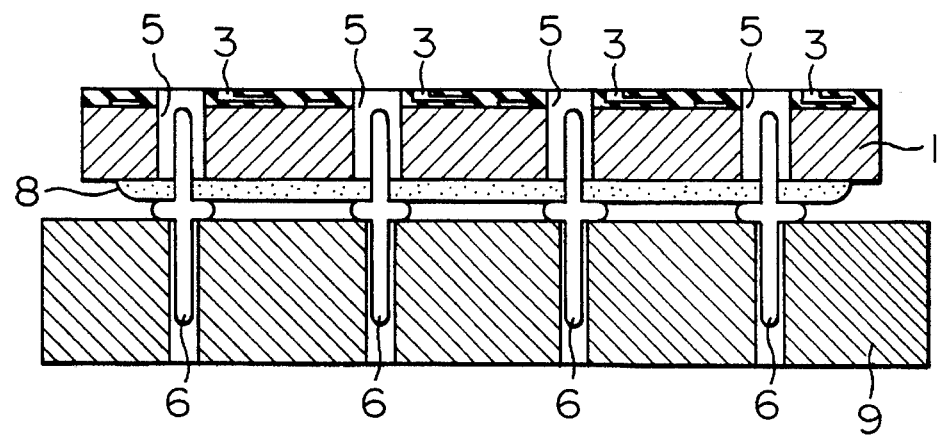
FIG. 5 is a cross-sectional view of the semiconductor device at one manufacturing step.

As shown in FIG. 3, the active devices 2, wiring conductors 3 and insulators 4 are formed on the substrate 1, for example, in a conventional manner, so that further description thereof will be omitted. As shown in FIG. 4, the through holes 5 are formed at positions adjacent to the wiring conductors 3 with a YAG laser, for example. As shown in FIG. 5, an adhesive 8 including an organic resin as a main component is coated on the back surface of the substrate 1 and the pins 6 arranged by a pin stand jig 9 are inserted together into the corresponding through holes 5. Then, as shown in FIGS. 6–8, the pins 6 are fixed to the substrate 1 within a chamber 10.

Figure 6:
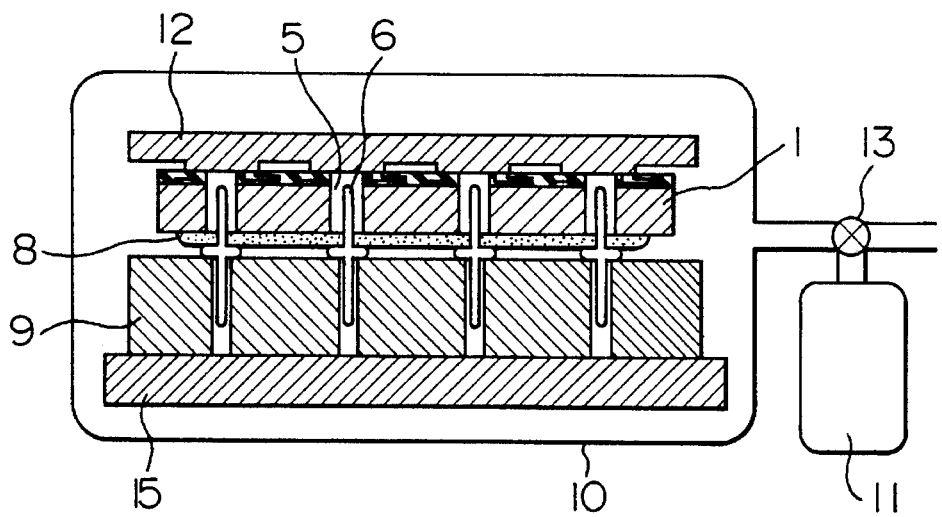
FIG. 6 is a cross-sectional view of the semiconductor device at one manufacturing step.
Figure 8:
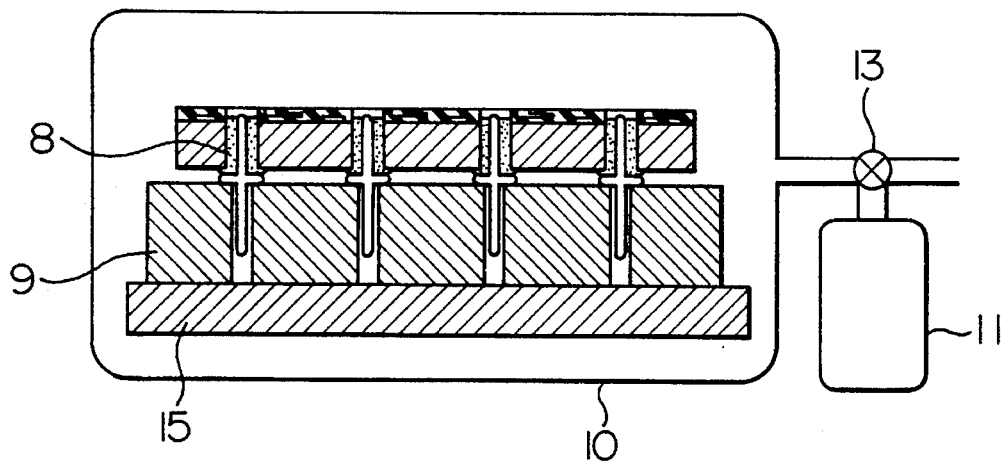
FIG. 8 is a cross-sectional view of the semiconductor device at one manufacturing step.
Figure 9:
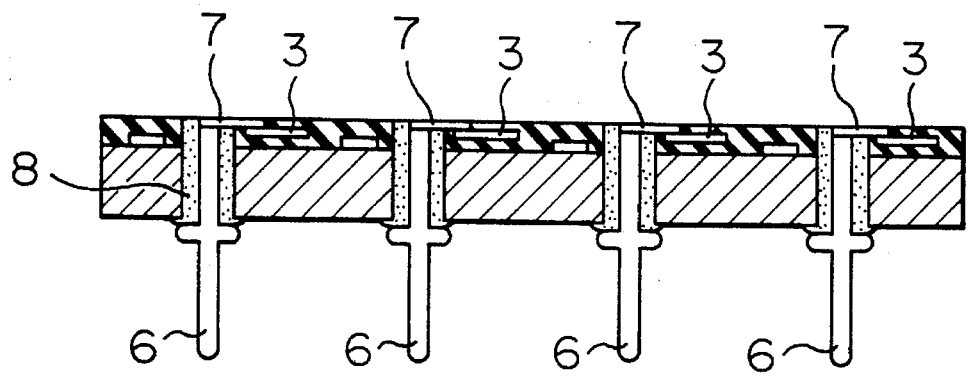
FIG. 9 is a cross-sectional view of the semiconductor device at one manufacturing step.

As shown in FIG. 6, the atmospheric pressure within the chamber 10 is evacuated to about 1 Torr by a vacuum pump 11 to thereby reduce the inner pressure of the through holes 5. Under this situation, a contacting plate 12 is caused to contact the substrate 1 to thereby hermetically seal the through holes 5 in an airtight manner. As shown in FIG. 7, the operation of the vacuum pump 11 is stopped, the valve 13 is released to thereby increase the inner pressure of the chamber 10 to about 760 Torr equal to the atmospheric pressure. At this time, a pressure difference occurs between the inside of the chamber 10 and the sealed inside of the through holes 5, so that high fluidity adhesive 8 flows into the lower-pressure through holes 5 to fill them. As shown in FIG. 8, the contacting plate 12 is then removed and the adhesive 8 is heated by a heater 15 for solidification. In this way, the conductive pins 6 are fixed to the substrate 1. Finally, as shown in FIG. 9, the leads 7 are formed by plating or metal deposition to electrically connect the pins 6 and wiring conductor 3.

Figure 7:
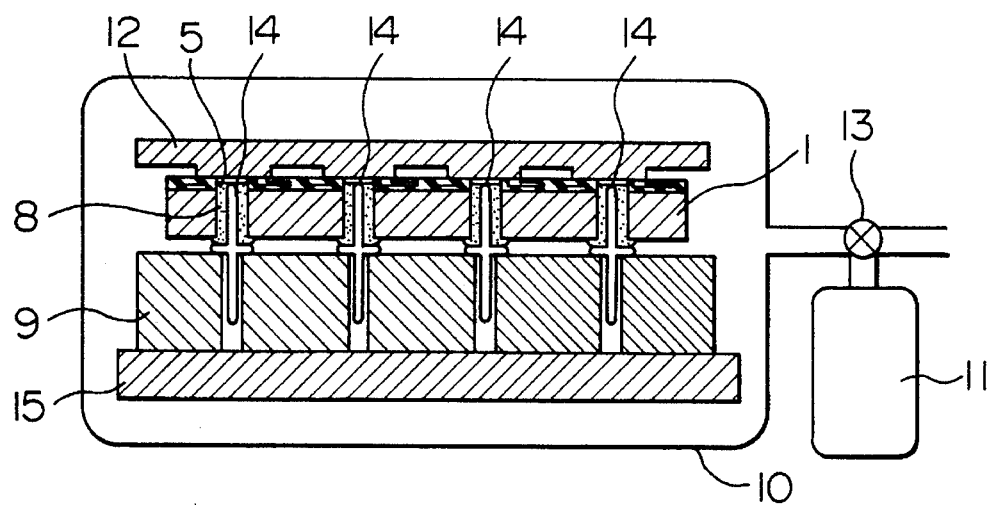
FIG. 7 is a cross-sectional view of the semiconductor device at one manufacturing step.

As particularly shown in FIG. 7, during the manufacturing process, the through holes 5 may not be completely filled with the adhesive 8, thereby leaving voids 14. In this case, the use of, for example, an adhesive 8 such as a fluororesin and a material that is hard to wet as the contacting plate 12 causes the voids 14 to remain collectively between the contacting plate 12 and the adhesives 8 to thereby prevent the occurrence of the voids in the adhesive. The adhesive 8 is filled evenly in each of the through holes 5 to thereby greatly improve the reliability of connection of the corresponding pin 6. As a result, the pins 6 are completely fixed to the substrate 1, so that some external force is allowed to be applied to the pins 6. Thus, an examination probe may be brought into contact with the respective pins 6 or a completed semiconductor substrate itself can be mounted on an examining board to thereby achieve easy examination of the semiconductor substrate.

Figure 10:
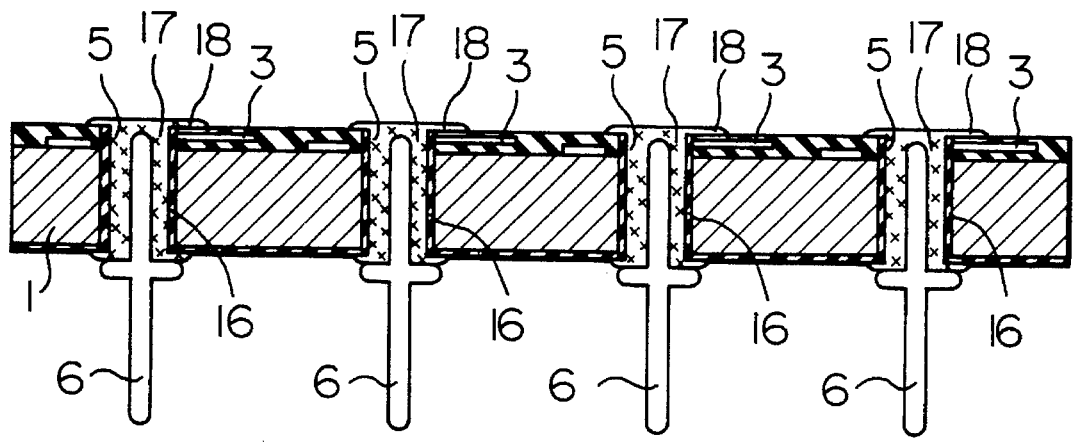
FIG. 10 is a cross-sectional view of a semiconductor device as a second embodiment of the present invention.

FIG. 10 is a cross-sectional view of a second embodiment of the semiconductor device according to the present invention. In the semiconductor device of FIG. 10, electrical connection of the pins 6 inserted into the through holes 5 and the wiring conductors 3 formed on the substrate 1 is achieved by a low melting-point metal 17 filled into the through holes 5. Reference numeral 18 denotes a metal layer (e.g., made of Au) on the wiring conductors 3 in order to provide a more secure electrical connection of the wiring conductors 3 and the low-melting point metal 17. Reference numeral 16 denotes an insulation film which prevents low melting-point metal 17 filled into adjacent through holes 5 from short-circuiting through the substrate 1.

In the present embodiment, each insulation film 16 is formed by vapor deposition (e.g., of a polyimide resin) or sputtering of $SiO_2$ to the side of the corresponding one of the through holes 5 after those through holes are formed in the substrate 1. The low melting-point metal is filled into the through holes 5 in a manner similar to the manufacturing method described with respect to FIGS. 3–9. A layer 18 of a metal such as gold that is easy to wet the low melting-point metal 17 is formed beforehand on the surface of the wiring conductors 3. The low melting-point metal 17 is joined to the metal layer 18 as soon as it is filled into the through hole 5 to thereby achieve the electrical connection of the wiring conductors 3 and the pins 6. Thus, in the present embodiment, no leads are required to be formed as in the first embodiment, which thereby improves productivity. Although not shown, the formation of a metal film easy to wet the low melting-point metal 17 on the side of the corresponding through hole 5 would improve the strength of fixing of the low melting-point metal 17.

Figure 11:
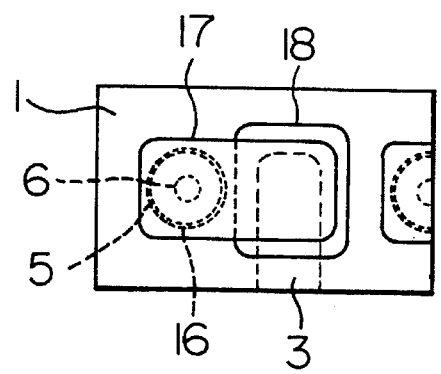
FIG. 11 is a fragmentary plan view of the semiconductor device as the second embodiment in the vicinity of a through hole.

FIG. 11 is a fragmentary plan view of the semiconductor substrate of the present embodiment, showing a complete one of the through holes 5. As described above, in the present embodiment, the pins 6 and the wiring conductors 3 are electrically connected by directly joining of the metal layers 18 formed on the wiring conductors 3 and the low melting-point metal 17 filled into the through holes 5. The low melting point metal 17 on the substrate 1 are easily increased in thickness to thereby reduce the electrical resistance of their joints compared to first embodiment, where the leads 7 are plated or vapor deposition-connected to the conductive pins 6 and the wiring conductors 3 in the first embodiment. Thus, even if the pins 6 are used as power supply terminals, power supply is achieved without voltage drops. No respective gaps are required to be provided between the wiring conductors 3 and the corresponding through holes 5, and the conductors 3 and the corresponding through holes 5 can be disposed close to each other, so that high density disposition of conductors and elements on the substrate 1 is achieved.

Figure 12:
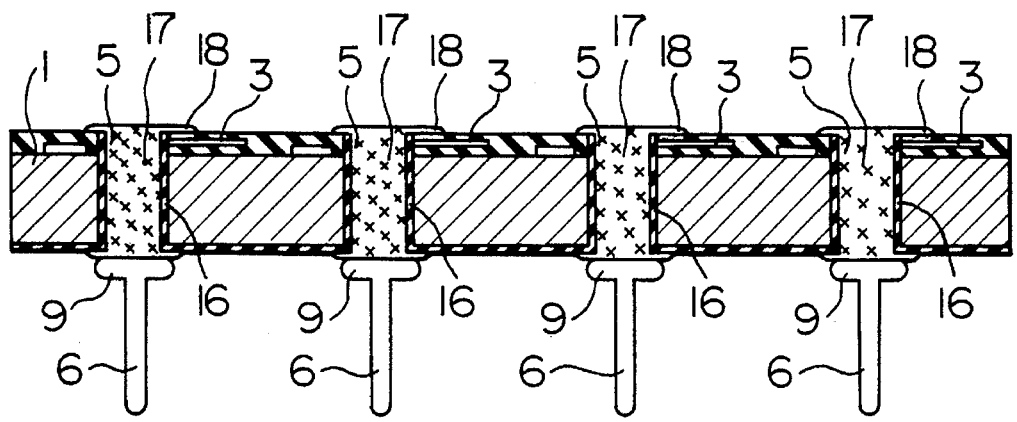
FIG. 12 is a cross-sectional view of a semiconductor device as a third embodiment of the present invention.

FIG. 12 is a cross-sectional view of a semiconductor device as a third embodiment of the present invention.

The device of FIG. 12 uses conductive pins 6 which have above the seats 9 no portions inserted into the through holes 5. The through holes 5 provided in the substrate 1 are filled completely with the low melting-point metal 17. The conductive pins 6 are joined to the corresponding portions of the melting point metal 17 exposed on the lower surface of the substrate 1. The low melting point metal 17 is electrically connected to the wiring conductors 3 formed on the upper surface of the substrate 1 with the pins 6 connected electrically to the wiring conductors 3 through the low melting-point metal 17. As in the second embodiment of FIG. 10, metal layers 18 (e.g., of gold) are provided between the corresponding wiring conductors 3 and low melting point metal 17 in order to ensure the electrical connection of the wiring conductors 3 and metal 17.

Since in the present embodiment the conductive pins 6 have no portions inserted into the through holes 5, or have flat tops, they can easily be formed by plastic-working of a conductor material to thereby improve productivity.

Figure 13:
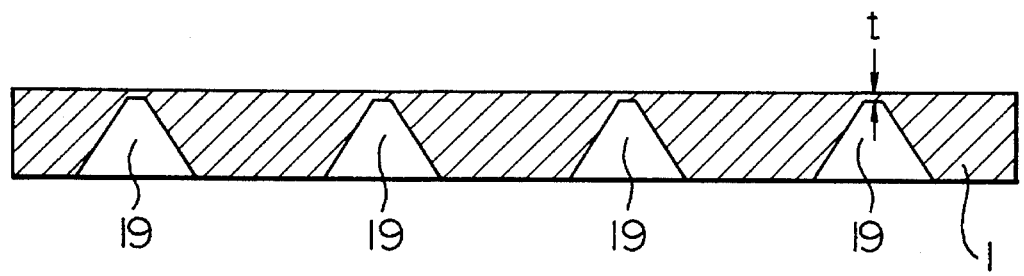
FIG. 13 is a cross-sectional view of a semiconductor device in the present invention, showing another example of the method of forming through holes in the semiconductor device.
Figure 14:
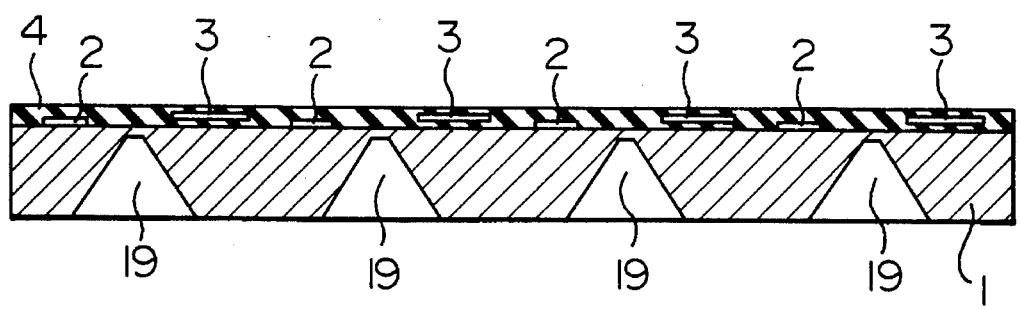
FIG. 14 is a cross-sectional view of a semiconductor device in the present invention, showing another example of the method of forming through holes in the semiconductor device.
Figure 15:
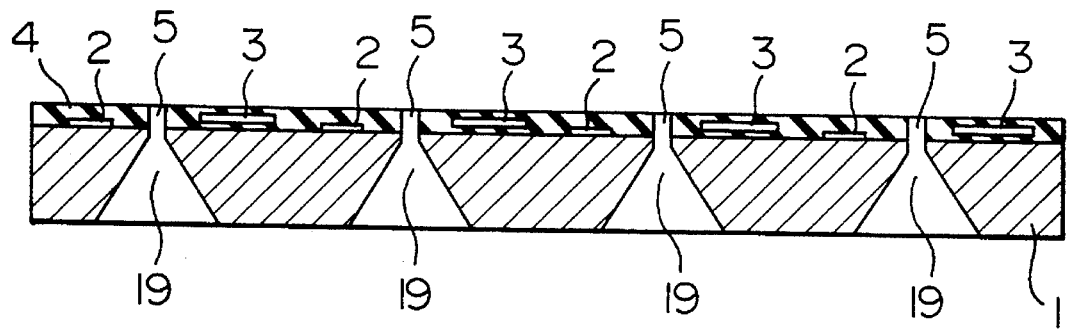
FIG. 15 is a cross-sectional view of a semiconductor device in the present invention, showing another example of the method of forming through holes in the semiconductor device.

Another method of manufacturing a semiconductor device according to the present invention will be described with respect to FIGS. 13–15, which show the cross sections of the device obtained at some of the steps of manufacturing the present embodiment. As shown in FIG. 13, a plurality of conical concavities 19 is formed on a lower or back surface of a semiconductor substrate 1, for example, by etching silicon in the substrate anisotropically with potassium hydroxide. The control of the etching speed and time thins the thickness t of the substrate at the bottom of the concavities 19 to about 10 microns. As shown in FIG. 14, active devices 2, wiring conductors 3, and insulators 4 are formed on an upper surface of the substrate 1. Thereafter, as shown in FIG. 15, through holes 5 are formed at the bottoms of the concavities 19 using dry etching with a YAG laser or an oxygen plasma.

In the present embodiment, the concavities 19 are provided beforehand in the substrate 1 to thereby thin the portions of the substrate 1 where the through holes 5 are formed in order to reduce the amount of stress to the substrate while forming the holes 5. Thus, compared to the above-mentioned manufacturing method, the reliability of the active devices 2 and the wiring conductors 3 which are liable to the influence of working distortion (on the substrate) and hence productivity, are improved. The aspect ratio (ratio of length to opening diameter) of the through holes 5 is small and hence the diameter of the through holes 5 in the substrate 1 is reduced further. Thus, the area of the substrate 1 where the conductors and elements are formed is increased to thereby provide a denser arrangement of the conductors and elements.

Figure 16:
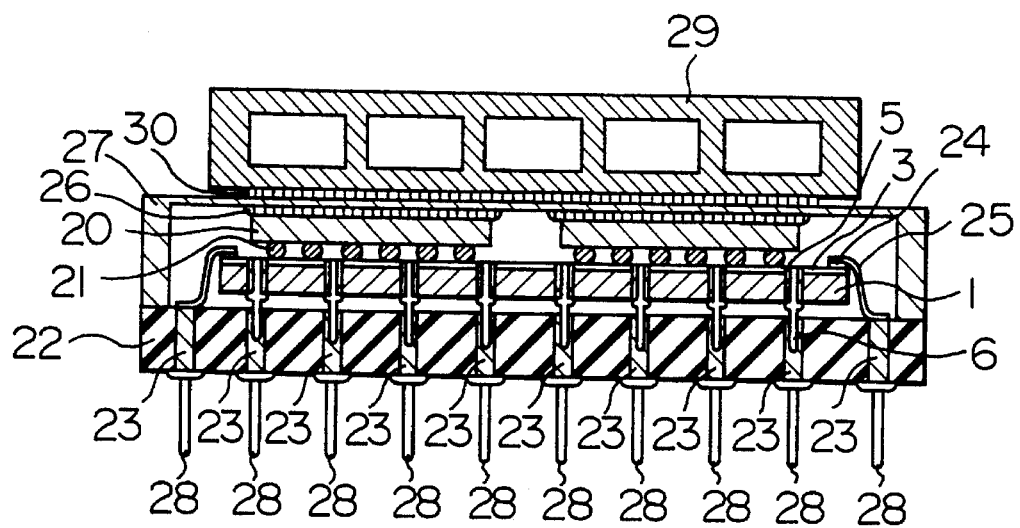
FIG. 16 is a cross-sectional view of a fourth embodiment of the semiconductor device according to the present invention.

FIG. 16 is a cross-sectional view of a semiconductor device indicative of a fourth embodiment of the present invention.

Reference numeral 1 denotes a semiconductor substrate with through holes 5 and conductive pins 6 which take signals from and deliver signals to electrical circuits formed on the substrate 1, as shown in the first-third embodiments. Provided above the substrate 1 are semiconductor elements 20 each with an electrical circuit and wiring conductors formed therein and electrically connected through solder bumps 21 to the electrical circuits formed on the substrate 1.

The substrate 1 is disposed on a wiring board 22 such that the pins 6 on the substrate 1 are connected electrically by soldering to the corresponding conductors 23 on the wiring board 22. The input/output terminals 24 provided on the outer periphery of the substrate 1 are electrically connected to the conductors 23 on the board 22 through a lead frame 25. A TAB may be used in place of the lead frame 25 for connection of the terminals 24 and the conductors 23.

A cap 27 is provided above the board 22 so as to cover the substrate 1 and the elements 20 whose upper surfaces contact the cap 27 through a heat conductor 26 made, for example, of solder or a heat conductive compound. The cap 27 and the wiring board 22 are joined, for example, by solder at the outer periphery. The semiconductor substrate 1 and the semiconductor elements 20 are hermetically sealed by the cap 27 and the wiring board 22 to be protected against the ambient atmosphere. Provided on the lower surface of the wiring board 22 are input/output pins 28 connected electrically to the conductors 23 to thereby connect the external semiconductor devices and power source electrically outside the wiring board 22.

A cooler 29 is provided on top of the cap 27 through a heat transfer device 30 made of, for example, solder or a heat-conductive compound and has paths through which a coolant such as water or a fluorocarbon is recirculated to cool the elements 20 and the substrate 1. Alternatively, the cooler 29 may be attached to the lower surface of the substrate 22. In this case, the heat produced at the semiconductor elements 20 and the substrate 1 is transferred through the input/output pins 28, the wiring conductors 23 and the pins 6 as the heat transmission path to the cooler for radiating purposes.

In the present embodiment, the semiconductor substrate 1 and the semiconductor elements 20 are provided on the wiring board 22, which is made of ceramics, in order to seal the devices elements 20 and the substrate 1 hermetically. The main material or Si of the substrate 1 and the elements 20 is different in coefficient of thermal expansion from the main material or ceramics of the wiring board 22, so that stresses due to thermal distortion produced during the manufacturing process concentrate on the juncture of the substrate 1 and board 22. These stresses due to thermal distortion become a greater problem as the size of the substrate 1 increases. Since in the present embodiment the substrate 1 and the board 22 are connected by the conductive pins 6 provided on the substrate 1, the diameter of the juncture is reduced connecting solder bumps and the height of the connecting pins are increased compared to the conventional solder bump connections, to thereby reduce the stresses due to the heat distortion satisfactorily. The use of the conductive pins 6 greatly increases the reliability of connection of the substrate 1 and the board 22.

While in the present embodiment the conductive pins 6 are illustrated as being inserted at upper portions into the through holes formed in the semiconductor substrate 1, as in the first or second embodiment, the reliability of connection of the substrate 1 and the board 22 is increased even if the conductive pins 6 that are not inserted into the through holes are used, as described with respect to the third embodiment.

In the present embodiment, a semiconductor device is realized which uses, for example, LSI circuitry which includes processors as semiconductor elements 20 which are connected by the active devices and conductors on the substrate 1. When, for example, a bipolar LSI is used as the semiconductor elements 20 in order to increase the operational speeds of these processors, large power is required to be fed to the semiconductor substrate 1 because the bipolar elements consume large power. When four semiconductor devices 20 of about 2 cm square are provided on a semiconductor substrate 1 of about 5 cm square, the amount of power fed to the substrate amounts to about 2,000 watts. In such a case, feeding power through the conductive pins 6 and inputting/outputting signals through a lead frame 25 avoids the coexistence of thick power source conductors and fine signal lines. As a result, the number of conductor layers on the substrate 1 is reduced. The substrate 1 and the semiconductor elements 20 are sealed hermetically in an airtight manner to thereby ensure high reliability. The cooler 29 is provided on the semiconductor elements 20 to thereby absorb the heat produced by the elements 20 or the substrate 1 efficiently and hence to operate them in a stabilized manner.

As described above, according to the present invention, a semiconductor device is realized in which many high-accuracy through hole conductors are formed

We claim:

1. A semiconductor device for holding wiring conductors, comprising:

a substrate made of a semiconductor material, having a plurality of through holes extending therethrough substantially perpendicularly to two main surfaces of said substrate;

a plurality of wiring conductors provided at a first one of said two main substrate surfaces;

electrically conductive material buried into each of said plurality of through holes, the electrically conductive material of each said through hole being electrically connected to at least one of said plurality of wiring conductors; and a plurality of electrically conductive pins each provided at a second one of said two main substrate surfaces at a position of a corresponding one of said through holes, each pin being electrically connected to said material buried into one of said through holes corresponding to said pin and having a portion extending from said second main substrate surface to outside of said substrate.

2. A semiconductor device according to claim 1, wherein each pin further has a portion inserted into said material buried into one of said through holes at which said pin is located.

3. A semiconductor device according to claim 1, wherein said material buried in each said through hole comprises a metal having a low melting point.

4. A semiconductor device according to claim 1, further comprising:

an insulating film formed at an inner surface of each said through hole for electrical isolation of said material buried into each said through hole from said substrate.

5. A semiconductor device according to claim 1, further comprising:

a metal lead provided at said first main substrate surface at a position of each said through hole for connecting one of the wiring conductors and said material buried into each said through hole.

6. A semiconductor device according to claim 1, wherein said substrate further has a plurality of active devices formed at said first main substrate surface, each active device being connected to at least one of said wiring conductors.

7. A semiconductor device according to claim 1, wherein each said through hole extends completely through said two main substrate surfaces, and has a tapered wall such that each said through hole is wider at the second main substrate surface and narrower at the first main substrate surface.

8. A semiconductor device according to claim 7, wherein the tapered walls of said through holes are formed by anisotropic etching.

9. A module of plural semiconductor elements, comprising:

a substrate made of a semiconductor material, having a plurality of through holes extending therethrough substantially perpendicularly to two main surfaces of said substrate;

a plurality of wiring conductors provided at a first one of said two main substrate surfaces;

electrically conductive material buried into each of said plurality of through holes, the electrically conductive material of each said through hole being electrically connected to at least one of said plurality of wiring conductors;

a plurality of electrically conductive pins each provided at a second one of said two main substrate surfaces at a position of a corresponding one of said through holes, each pin being electrically connected to said material buried into one of said through holes corresponding to said pin and having a portion extending from said second main substrate surface to outside of said substrate;

a plurality of semiconductor elements each disposed on said first main substrate surface of said substrate, each semiconductor element having a circuit and a plurality of wiring conductors connected thereto at a first one of two main surfaces of said semiconductor element, said first main semiconductor element surface facing said first main substrate surface; and a plurality of electrical conductors interposed between said first main semiconductor element surface and said first main substrate surface for electrically connecting at least part of said wiring conductors provided at said semiconductor element and at least part of said wiring conductors formed at said substrate.

10. A module according to claim 9, further comprising:

a wiring board for supporting said substrate, said wiring board including a plurality of pin connectors each having a vacancy for holding one of said conductive pins.

11. A module according to claim 10, further comprising:

a plurality of input/output terminals formed at an outer periphery of said first main substrate surface; and metal leads for connecting said input/output terminals and said wiring conductors formed on said wiring board.

12. A module according to claim 10, further comprising:

a cap provided over said wiring board to cover said substrate and said plurality of semiconductor elements against the external atmosphere.

13. A module according to claim 12, further comprising a cooler provided in thermal contact with an upper surface of a top of said cap, and a thermally conductive plate inserted between and in thermal contact with a lower surface of the top of said cap and a second one of said two main semiconductor element surfaces of each semiconductor element.

14. A module of plural semiconductor elements according to claim 9, wherein said electrical conductors comprise a plurality of solder bumps.

15. A module of plural semiconductor elements according to claim 9, wherein each pin further has a portion inserted into said material buried into one of said through holes at which said pin is located.

16. A module of plural semiconductor elements according to claim 9, wherein said material buried in each said through hole comprises a metal having a low melting point.

17. A module of plural semiconductor elements according to claim 9, further comprising:

an insulating film formed at an inner surface of each said through hole for electrical isolation of said material buried into each said through hole from said substrate.

18. A module of plural semiconductor elements according to claim 9, further comprising:

a metal lead provided at said first main substrate surface at a position of each said through hole for connecting one of the wiring conductors and said material buried into each said through hole.

19. A module of plural semiconductor elements according to claim 9, wherein said substrate further has a plurality of active devices formed at said first main substrate surface, each active device being connected to at least one of said wiring conductors.

20. A module of plural semiconductor elements according to claim 9, wherein each said through hole extends completely through said two main substrate surfaces, and has a tapered wall such that each said through hole is wider at the second main substrate surface and narrower at the first main substrate surface.

21. A module of plural semiconductor elements according to claim 20, wherein the tapered walls of said through holes are formed by anisotropic etching.

22. A module of plural semiconductor elements, comprising:

a substrate made of a semiconductor material, having a plurality of through holes extending therethrough substantially perpendicular to two main surfaces of said substrate;

a plurality of wiring conductors provided at a first one of said two main substrate surfaces;

an adhesive material buried into each of said plurality of through holes;

a plurality of electrically conductive pins each provided on a second one of said two main substrate surfaces at a position of a corresponding one of said through holes, each pin having a first portion extending from said second main substrate surface to outside of said substrate and a second portion extending to said first main semiconductor substrate surface through said material buried into one of said through holes corresponding to said pin, said second portion being electrically connected to one of said plurality of wiring conductors;

a plurality of semiconductor elements each disposed on said first main substrate surface, each semiconductor element having a plurality of circuit elements and a plurality of wiring conductors connected thereto at a first one of two main surfaces of said semiconductor element, said first main semiconductor element surface facing said first main substrate surface; and a plurality of electrical conductors interposed between said first main semiconductor element surface and said first main substrate surface for electrically connecting at least part of said wiring conductors provided at said semiconductor element and at least part of said wiring conductors formed at said substrate.

23. A module of plural semiconductor elements according to claim 22, wherein said electrical conductors comprise a plurality of solder bumps.

24. A module of plural semiconductor elements according to claim 22, further comprising:
a wiring board for supporting said substrate, said wiring board including a plurality of pin connectors each having a vacancy for holding one of said conductive pins.

25. A module of plural semiconductor elements according to claim 24, further comprising:
a plurality of input/output terminals formed at an outer periphery of said first main substrate surface; and
metal leads for connecting said input/output terminals and said wiring conductors formed on said wiring board.

26. A module of plural semiconductor elements according to claim 25, further comprising:
a cap provided over said wiring board to cover said substrate and said plurality of semiconductor elements against the external atmosphere.

27. A module of plural semiconductor elements according to claim 26, further comprising a cooler provided in thermal contact with an upper surface of a top of said cap, and a thermally conductive plate inserted between and in thermal contact with a lower surface of the top of said cap and a second one of said two main semiconductor element surfaces of each semiconductor element.

28. A module of plural semiconductor elements according to claim 22, further comprising:
an electrically conductive lead provided for each said through hole at said first main substrate surface for electrically connecting said second portion of one of said plurality of pins provided at said through hole and one of the wiring conductors.

29. A module of plural semiconductor elements according to claim 22, wherein said material buried in each said through hole mainly comprises an organic resin.

30. A module of plural semiconductor elements according to claim 22, wherein each said through hole extends completely through said two main substrate surfaces, and has a tapered wall such that each said through hole is narrower at said first main substrate surface and wider at said second main substrate surface.

31. A module of plural semiconductor elements according to claim 30, wherein the tapered walls of said through holes are formed by anisotropic photoetching.

32. A module of plural semiconductor elements according to claim 22, further comprising a plurality of electrically active devices formed at said first main substrate surface and each connected to at least one of said wiring conductors.

33. A semiconductor device for holding wiring conductors, comprising:
a substrate made of a semiconductor material, having a plurality of through holes extending therethrough substantially perpendicularly to two main surfaces of said substrate;
a plurality of wiring conductors provided at a first one of said two main surfaces and suitable for electrical connection to a group of wiring conductors included in another semiconductor device which includes a circuit and is to be provided on said substrate;
an adhesive material buried into each of said plurality of through holes; and
a plurality of electrically conductive pins each provided on a second one of said two main substrate surfaces at a position of a corresponding one of said through holes, each pin having a first portion extending from said second main substrate surface to outside of said substrate and a second portion extending to said first main substrate surface through said material buried into one of said one through holes corresponding to said pin, said second portion being electrically connected to one of said plurality of wiring conductors.

34. A semiconductor device according to claim 33, further comprising:
an electrically conductive lead provided for each said through hole at said first main substrate surface for electrically connecting said second portion of one of said plurality of pins provided at said through hole and one of the wiring conductors.

35. A semiconductor device according to claim 33, wherein said material buried in each said through hole mainly comprises an organic resin.

36. A semiconductor device according to claim 33, wherein each said through hole extends completely through said two main substrate surfaces, and has a tapered wall such that each said through hole is narrower at said first main substrate surface and wider at said second main substrate surface.

37. A semiconductor device according to claim 36, wherein the tapered walls of said through holes are formed by anisotropic photoetching.

38. A semiconductor device according to claim 33, further comprising a plurality of electrically active devices formed at said first main substrate surface and each connected to at least one of said wiring conductors.

39. A semiconductor device according to claim 6, wherein at least one of said pins is electrically connected to one of said active devices via one of said wiring conductors.

40. A module according to claim 20, wherein at least one of said pins is electrically connected to one of said semiconductor elements via one of said wiring conductors.

41. A module according to claim 32, wherein at least one of said pins is electrically connected to one of said electrically active devices via one of said wiring conductors.

42. A semiconductor device according to claim 38, wherein at least one of said pins is electrically connected to one of said electrically active devices via one of said wiring conductors.

43. A semiconductor device, comprising:
a substrate made of a semiconductor material and having a plurality of through holes extending therethrough substantially perpendicularly to two main surfaces of said substrate;
a plurality of electrically active devices provided at a first one of the two main surfaces of said substrate;
electrically conductive material buried into each of said plurality of through holes, the electrically conductive material of each said through hole being electrically connected to one of said plurality of wiring conductors;
a plurality of electrically conductive pins each provided on a second one of said two main substrate surfaces at a position of a corresponding one of said through holes, each pin being electrically connected to said material buried into one of said through holes corresponding to said each pin and having a first portion extending from said second main substrate surface to outside of said substrate; and
a plurality of wiring conductors provided at the first one of said two main surfaces, each wiring conductor being connected to the electrically conductive material in one of said plurality of through holes and to one of said plurality of electrically active devices.

44. A semiconductor device according to claim 43, wherein each pin further has a second portion extending to said first main substrate surface through said material buried into said one of said through holes corresponding to said pin, said second portion being electrically connected to one of said plurality of wiring conductors.

45. A semiconductor device according to claim 43, further comprising:

an electrically conductive lead provided for each said through hole at said first main substrate surface for electrically connecting said second portion of one of said plurality of pins provided at said through hole to one of said wiring conductors.

46. A semiconductor device according to claim 43, wherein each said through hole extends completely through said two main substrate surfaces, and has a tapered wall such that each said through hole is narrower near said first main substrate surface and wider near said second main substrate surface.

47. A semiconductor device according to claim 46, wherein said tapered walls are formed by anisotropic photoetching.

48. A semiconductor device according to claim 43, further comprising:

an adhesive material buried into each of said plurality of through holes.

49. A semiconductor device according to claim 48, wherein said adhesive material buried in each through hole mainly comprises an organic resin.

* * * * *